US010735034B1

(12) United States Patent
Diduck

(10) Patent No.: US 10,735,034 B1
(45) Date of Patent: Aug. 4, 2020

(54) POLAR MODULATION TRANSMITTER WITH WIDEBAND PRODUCT MODE CONTROL

(71) Applicant: Eridan Communications, Inc., Santa Clara, CA (US)

(72) Inventor: Quentin Diduck, Santa Clara, CA (US)

(73) Assignee: Eridan Communications, Inc., Mountain View, CA (US)

( * ) Notice: Subject to any disclaimer, the term of this patent is extended or adjusted under 35 U.S.C. 154(b) by 0 days.

(21) Appl. No.: 16/539,844

(22) Filed: Aug. 13, 2019

(51) Int. Cl.
| H04B 1/04 | (2006.01) |
| H03F 1/02 | (2006.01) |
| H03F 3/20 | (2006.01) |
| H03F 3/24 | (2006.01) |
| H04L 27/12 | (2006.01) |

(52) U.S. Cl.
CPC .............. *H04B 1/04* (2013.01); *H03F 3/245* (2013.01); *H04L 27/12* (2013.01); *H03F 2200/451* (2013.01); *H03F 2200/69* (2013.01)

(58) Field of Classification Search
CPC ....... H04B 1/04; H04B 2001/045; H03F 1/02; H03F 1/0205; H03F 1/0211; H03F 1/025; H03F 3/189; H03F 3/19; H03F 3/20; H03F 3/217
See application file for complete search history.

(56) References Cited

U.S. PATENT DOCUMENTS

| 9,397,621 | B2* | 7/2016 | McCune, Jr. | ......... H03F 3/2171 |
| 9,397,713 | B1* | 7/2016 | Kirkpatrick | .......... H04B 1/0475 |
| 9,806,678 | B2* | 10/2017 | Diduck | .................... H03F 1/42 |
| 2010/0178886 | A1* | 7/2010 | Pennec | ............... H04B 1/3822 |
| | | | | 455/127.1 |

OTHER PUBLICATIONS

E. McCune, Dynamic Power Supply Transmitters, 2015, Cambridge University Press, Cambridge, UK, ISBN 9781107059177.

* cited by examiner

*Primary Examiner* — Blane J Jackson
(74) *Attorney, Agent, or Firm* — Patent Law Professionals, P.C.; William E. Winters

(57) ABSTRACT

A wideband polar modulation transmitter includes a power amplifier (PA), a PA driver, a dynamic power supply (DPS), a PA driver $V_H$ controller, and a phase modulator. The phase modulator modulates a radio frequency (RF) carrier by an input phase modulating signal PM(t) to produce a phase modulated RF carrier. Meanwhile, the DPS produces a DPS voltage for the PA that follows an input amplitude modulating signal AM(t). Using the phase modulated RF carrier, the PA driver generates a PA drive signal $V_{DRV}$ for driving the PA. The PA drive signal $V_{DRV}$ has a high drive level $V_H$ and a low drive level $V_L$. The PA driver $V_H$ controller is configured to control the magnitude of the high drive level $V_H$ so that it remains sufficiently high to force the PA to operate in a compressed mode (C-mode) most of the time but lowers the high drive level $V_H$ to force the PA to operate in a product mode (P-mode) during times low-magnitude events occur in the DPS voltage.

10 Claims, 10 Drawing Sheets

POLAR MODULATION TRANSMITTER WITH WIDEBAND PRODUCT MODE CONTROL

BACKGROUND OF THE INVENTION

Modern radio frequency (RF) communications systems employ complex modulation schemes in which both the magnitude and the angle (phase or frequency) of an RF carrier are modulated to convey information. These complex modulation schemes are used since they increase spectral efficiency. However, they also make it difficult to design an RF transmitter that is energy efficient. Energy efficiency is particularly important in RF transmitters that are battery powered, such as an RF transmitter in a mobile handset, for example. Since the RF transmitter's power amplifier (PA) is usually the component in the RF transmitter that consumes and dissipates the most power, designing the PA so that it operates as efficiently as possible is often one of the principal goals involved in the design of an RF transmitter. Achieving high energy efficiency is met with difficulty, however, particularly in RF transmitters that employ so-called "linear PAs" (e.g., Class A, AB and B PAs). Because the signal envelope of the RF transmitter's RF output varies over time when complex modulation schemes are used, the RF output power must be backed off to avoid signal peak clipping, i.e., to maintain linearity. Unfortunately, the need to back off the output power severely limits the realizable efficiency of the PA and consequently the RF transmitter as a whole, especially when the applied modulation scheme produces an RF output having a high peak-to-average power ratio (PAPR).

One way to circumvent the low energy efficiency limitations that afflict linear PAs is to employ a different type of RF transmitter known as a "polar modulation" transmitter. As illustrated in FIG. 1, a polar modulation transmitter 100 comprises a dynamic power supply (DPS) 102, a phase modulator 104, and a switch-mode PA (SMPA) 106. Operating in the polar domain, the DPS 102 modulates a direct current (DC) power supply voltage $V_{DD}(DC)$ by an input amplitude modulating signal AM(t) to produce a dynamic power supply voltage $V_{DD}(t)$, while the phase modulator 104 modulates an RF carrier by an input phase modulating signal PM(t) to produce a phase modulated RF carrier. The SMPA 106 typically comprises a power field-effect transistor (FET) 108 with its drain configured to receive the DPS voltage $V_{DD}(t)$, via an RF choke 110, and its gate configured to receive the phase-modulated RF carrier $RF_{IN}$, after first being AC coupled via AC coupling capacitor 112 and biased by a DC bias voltage $V_{BIAS}$. The DC bias $V_{BIAS}$ and level-to-level swing of $RF_{IN}$ are both set during design so that when the AC-coupled and DC-biased RF input signal $RF_{IN}$ applied to the gate of the power FET 108 switches the SMPA 106 ON and OFF, between compressed and cut-off states. This 'switch mode' operation is referred to in the power amplifier arts as "compressed mode" or "C-mode."

One important property and advantage the SMPA 106 has over linear PAs is that its RF output power $P_{OUT}$ is directly proportional to the square of the magnitude of the DPS voltage $V_{DD}(t)$, i.e., $P_{OUT} \propto V_{DD}^2(t)$. This dependency is exploited in the polar modulation transmitter 100 to superimpose the signal envelope carried by the original input amplitude modulating signal AM(t) (i.e., the "intended" AM) onto the RF output $RF_{OUT}$. Specifically, as the SMPA 106 translates the phase-modulated RF carrier $RF_{IN}$ to higher RF power it also modulates the RF output $RF_{OUT}$ of the SMPA 106 by the DPS voltage $V_{DD}(t)$ produced by the DPS 102, so that, ideally, the signal envelope of the RF output $RF_{OUT}$ exactly follows the original input amplitude modulating signal AM(t).

Introducing the AM through the drain supply of the SMPA 106 is known in the power amplifier arts as "drain modulation," and is an ability that avoids having to apply the AM through the RF input of the SMPA 106, i.e., to the gate of its power FET 108. Since the phase-modulated RF carrier $RF_{IN}$ has a constant envelope, the need to back off the RF output power $P_{OUT}$ in order to avoid signal peak clipping is therefore obviated. This drain modulation capability together with the fact that the FET 108 is controlled to operate as a switch, rather than a controlled current source as in linear PAs, makes the polar modulation transmitter 100 significantly more energy efficient than RF transmitters constructed from linear PAs.

Although polar modulation transmitters are significantly more energy efficient than transmitters constructed from linear PAs, the bandwidths of the polar domain constant-envelope phase-modulated RF carrier and amplitude modulated DPS voltage $V_{DD}(t)$ are often very wide. For example, as can be seen in FIGS. 2 and 3, which are waveform snippets of the signal envelopes typically observed in communications systems operating according to the Wideband Code Division Multiple Access (W-CDMA) air interface (FIG. 2) and Long-Term Evolution (LTE) interface (FIG. 3), the signal envelopes tend to fall to zero (or near zero) and inflect back from zero (or near zero) abruptly. These sharply-inflecting low-magnitude events occupy a wide bandwidth when represented in the frequency domain, and conventional polar modulation transmitters, like the polar modulation transmitter 100 described above, are unfortunately unable to resolve them at their RF outputs $RF_{OUT}$. The invention described below addresses and provides a solution to this problem.

BRIEF SUMMARY OF THE INVENTION

A wideband polar modulation transmitter is disclosed. The wideband polar modulation transmitter comprises a power amplifier (PA), a PA driver, a dynamic power supply (DPS), a PA driver $V_H$ controller, and a phase modulator. The phase modulator modulates a radio frequency (RF) carrier by an input phase modulating signal PM(t) to produce a phase modulated RF carrier. Meanwhile, the DPS produces a DPS voltage for the PA that follows an input amplitude modulating signal AM(t). Using the phase modulated RF carrier, the PA driver generates a PA drive signal $V_{DRV}$ for driving the PA. The PA drive signal $V_{DRV}$ has a high drive level $V_H$ and a low drive level $V_L$. The PA driver $V_H$ controller is configured to control the magnitude of the high drive level $V_H$ so that it remains sufficiently high to force the PA to operate in a compressed mode (C-mode) most of the time but lowers the high drive level $V_H$ to force the PA to operate in a product mode (P-mode) during times low-magnitude events occur in the DPS voltage.

Further details of the invention, including a detailed description of the above-summarized and other exemplary embodiments of the invention, will now be described with reference to the accompanying drawings, in which like reference numbers are used to indicate identical or functionally similar elements.

DETAILED DESCRIPTION

Figure 1:
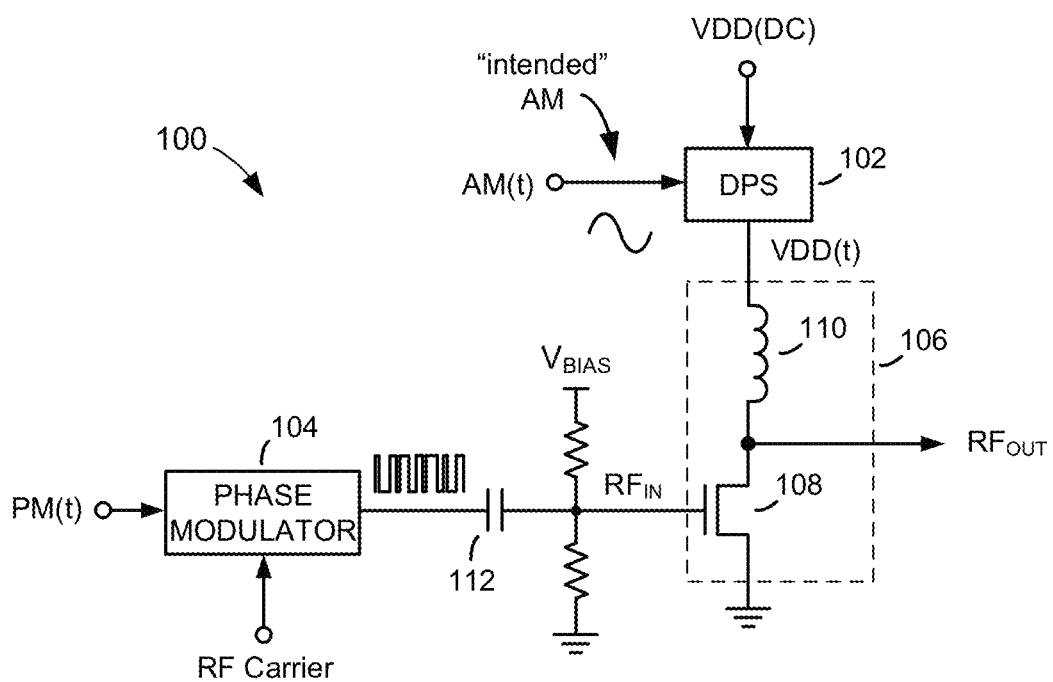
FIG. 1 is a simplified diagram of a conventional polar modulation transmitter.
Figure 2:
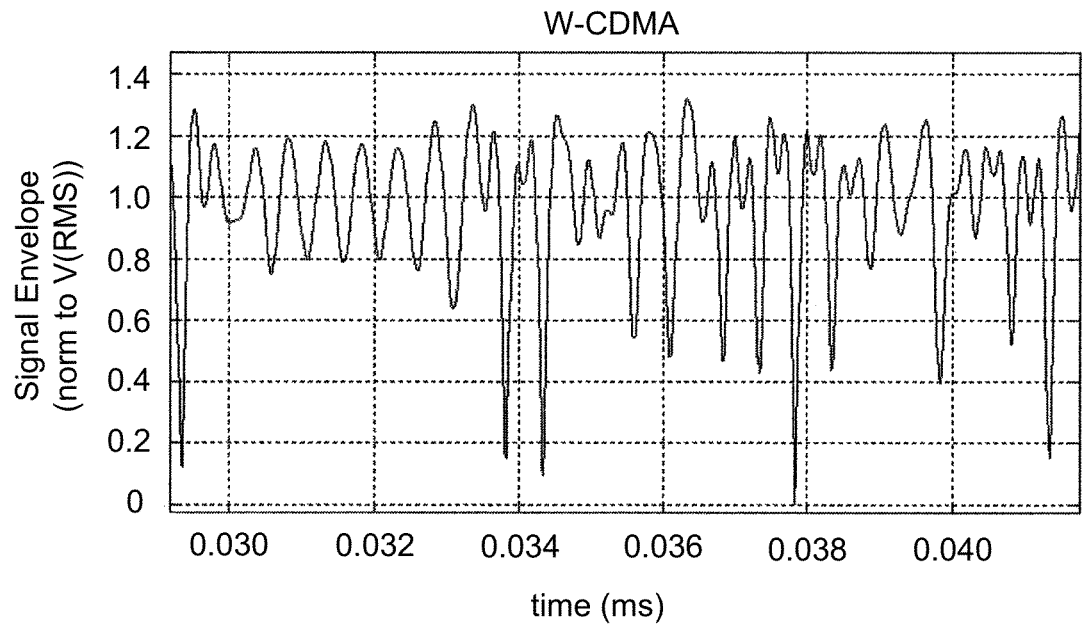
FIGS. 2 and 3 are waveform snippets of typical signal envelope waveforms observed in communications systems operating in accordance with the Wideband Code Division Multiple Access (W-CDMA) air interface and Long-Term Evolution (LTE) interface, respectively.
Figure 3:
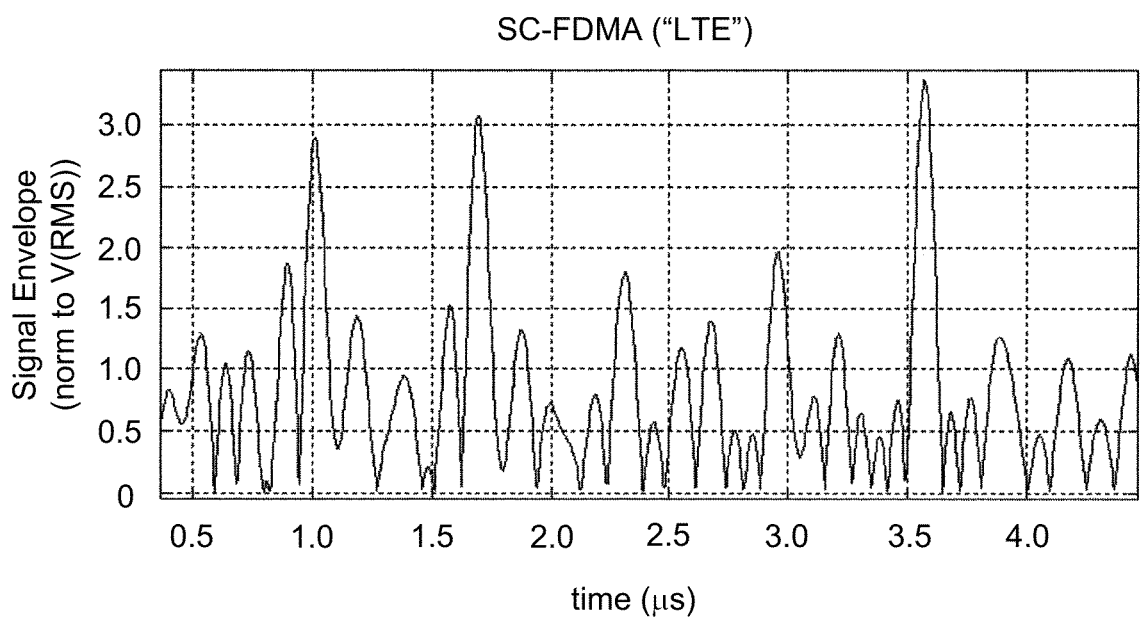
Figure 4:
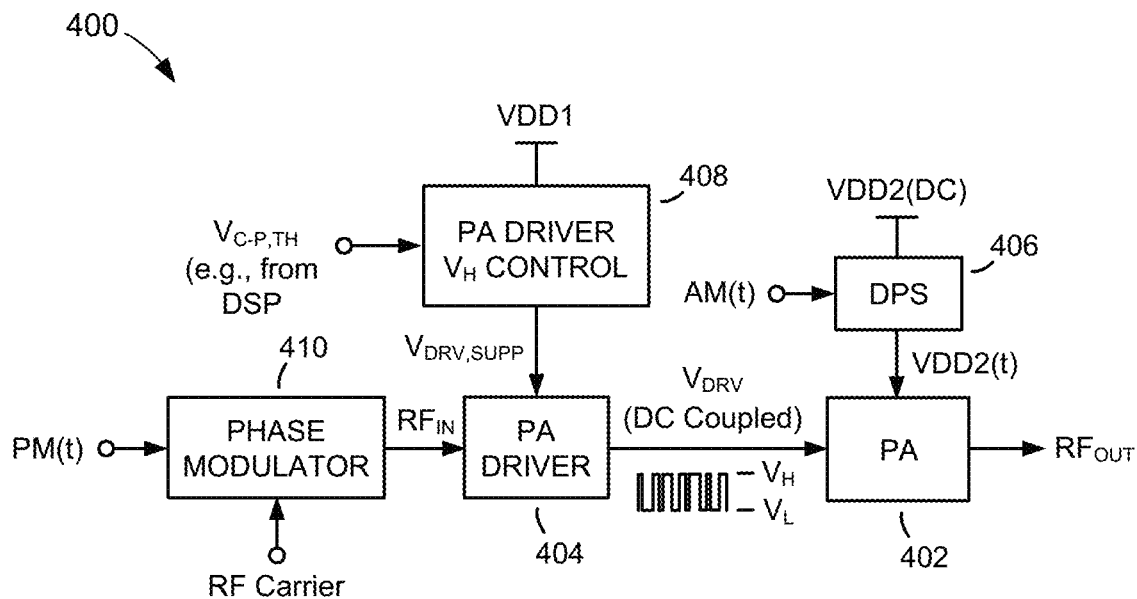
FIG. 4 is a drawing depicting a polar modulation transmitter that is configurable to operate in a compressed mode (C-mode) and, alternatively, in a product mode (P-mode), according to one embodiment of the present invention.

Referring to FIG. 4, there is shown a drawing of a polar modulation transmitter 400, according to one embodiment of the present invention. The polar modulation transmitter 400 comprises a power amplifier (PA) 402, a PA driver 404, a dynamic power supply (DPS) 406, a PA driver $V_H$ controller 408, and a phase modulator 410. Similar to as in the conventional polar modulation transmitter 100, the DPS 406 in the polar modulation transmitter 400 of the present invention modulates a direct current (DC) power supply voltage VDD2(DC) by an input amplitude modulating signal AM(t) to produce a dynamic power supply voltage VDD2(t), and the phase modulator 410 modulates an RF carrier by an input phase modulating signal PM(t) to produce a phase modulated RF carrier $RF_{IN}$. However, unlike the conventional polar modulation transmitter 100, the polar modulation transmitter 400 further includes a PA driver 404 and a PA driver $V_H$ controller 408 that are designed and configured to drive the PA 402 so that it operates in compressed mode (i.e., "C-mode") and, under certain conditions, alternatively in product mode (i.e., "P-mode").

The drive signal $V_{DRV}$ produced by the PA driver 404 has a low drive level $V_L$ and a high drive level $V_H$. The PA driver $V_H$ controller 408 serves to control a driver power supply $V_{DRV,SUPP}$ for the PA driver 404, and the driver power supply $V_{DRV,SUPP}$ that is supplied determines what magnitude the high drive level $V_H$ is at any given time. Most of the time the PA driver $V_H$ controller 408 maintains the magnitude of the driver power supply $V_{DRV,SUPP}$ and high drive level $V_H$ at a magnitude sufficient to force the PA 404 to operate in C-mode, but lowers the high drive level $V_H$ to force the PA 404 to operate in P-mode during times low-magnitude events occur in the DPS voltage VDD2(t). In one embodiment of the invention low-magnitude events in the DPS voltage VDD2(t) are determined beforehand at baseband by a digital signal processor (DSP), i.e., before they appear in the DPS voltage VDD2(t), by monitoring the magnitude of the input amplitude modulating signal AM(t) (referred to as the "intended AM in the description that follows). In one embodiment of the invention, when the DSP determines that the magnitude of the intended AM has dropped below some predetermined C-mode/P-mode voltage threshold $V_{C-P,TH}$, it directs the PA driver $V_H$ controller 408 to lower the power supply $V_{DRV,SUPP}$ so that the high drive level $V_H$ is lowered and so that the PA 404 will operate in P-mode when the low-magnitude event appears in the DPS voltage VDD2(t), and for the duration of the low-magnitude event. Controlling the driver power supply $V_{DRV,SUPP}$ and the high drive level $V_H$ of the PA drive signal $V_{DR-v}$ so that the PA 402 operates in P-mode overcomes the inability it would otherwise have at reproducing low-magnitude events it its RF output $RF_{OUT}$ if it could only operate in C-mode. Augmenting C-mode operation with P-mode operation thus provides the polar modulation transmitter 400 the ability to operate over a wider bandwidth, compared to if it was only able to operate in C-mode, and to produce an RF output power $P_{OUT}$ that covers a wider dynamic range.

Figure 5:
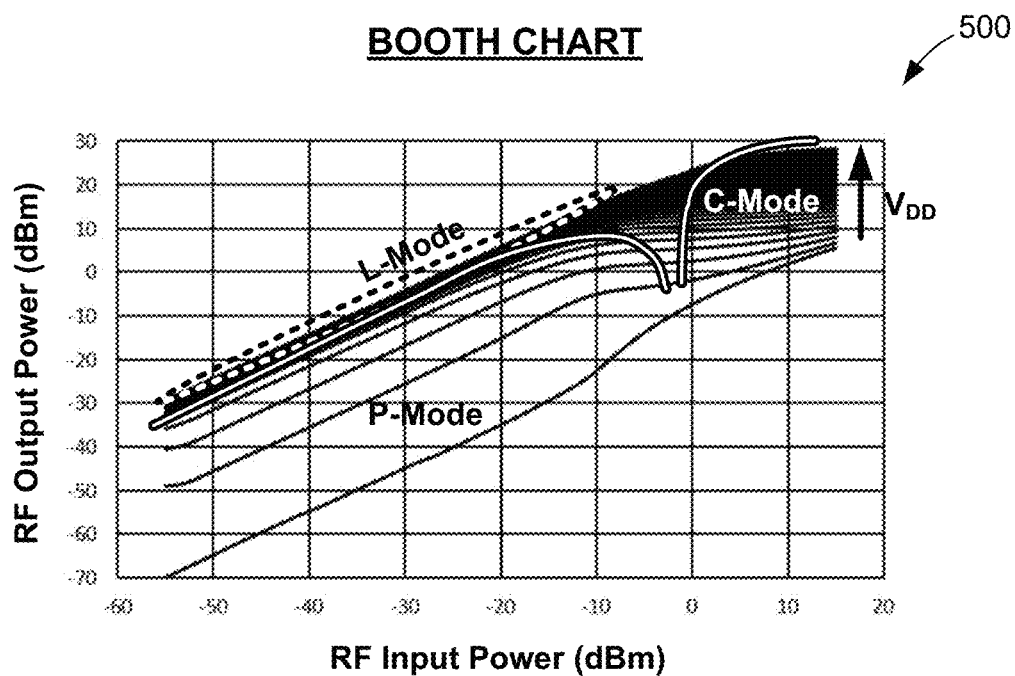
FIG. 5 is a Booth chart that illustrates if and how the RF output power produced by a power amplifier (PA) depends on its drain power supply voltage VDD and RF input power when configured to operate according to three different operating modes—linear mode (i.e., "L-mode"), P-mode, and C-mode.

To illustrate how controlling the PA 402 to operate in P-mode overcomes the inability of C-mode to reproduce low-magnitude events in the output signal envelope, reference is made to the Booth chart 500 in FIG. 5. The Booth chart 500 shows how the RF output power $P_{OUT}$ produced by the PA 402 is influenced by variations in both the magnitude of the DPS voltage VDD2(t) and the magnitude of the RF input power applied to the RF input of the PA 402, when the PA 402 is configured for operation in three different operating modes—linear mode (i.e., "L-mode"), P-mode, and C-mode. Each curve in the Booth chart 500 represents a different power supply voltage VDD2 applied to the PA 402. When the PA 402 is controlled to operate in C-mode, the Booth chart 500 reveals that the RF output power $P_{OUT}$ produced by the PA 402 is sensitive to variations in the drain supply voltage VDD2 but not to variations in the RF input power. In contrast, if the PA 402 was to be controlled so that it operates in L-mode, which is representative of a linear PA (e.g., a Class-A, B, or AB linear PA), the Booth chart 500 reveals that the RF output power $P_{OUT}$ produced by the PA 402 would be sensitive to variations in the RF input power but not to variations in the drain supply voltage VDD2. This dependency of the linear PA follows from the fact that a linear PA operates as a controlled current source—not as a switch (as in C-mode)—and consequently is largely unaffected by variations in its drain supply voltage. Finally, when the PA 402 is controlled so that it operates in P-mode, the Booth chart 500 reveals that the RF output power $P_{OUT}$ produced by the PA 402 depends on both variations in the magnitude of the drain supply voltage VDD2 and variations in the RF input power. In fact, it can be shown that when the PA 402 is controlled to operate in P-mode, its RF output power Pour is proportional to the product of the magnitude of the drain supply voltage VDD2 and the magnitude of the gate drive signal $V_{GS}=V_{DRV}$, i.e., $P_{out} \alpha VDD2 \times V_{GS}$, hence the name "product mode."

Figure 6:
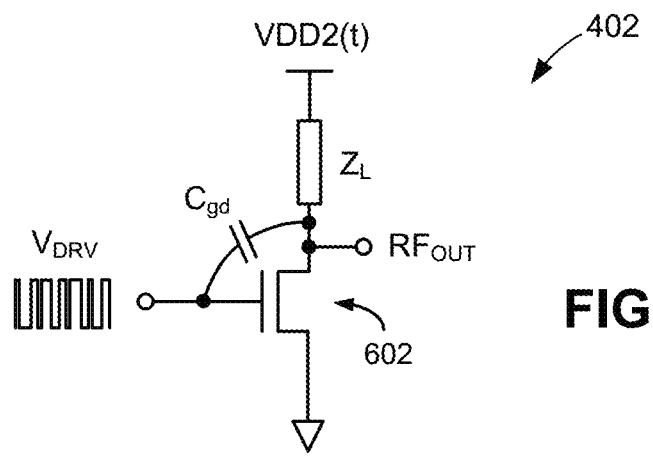
FIG. 6 is a simplified schematic drawing of the PA of the polar modulation transmitter depicted in FIG. 4, highlighting how the power field-effect transistor (FET) in the PA has a built-in parasitic gate-drain capacitor $C_{gd}$.
Figure 7:
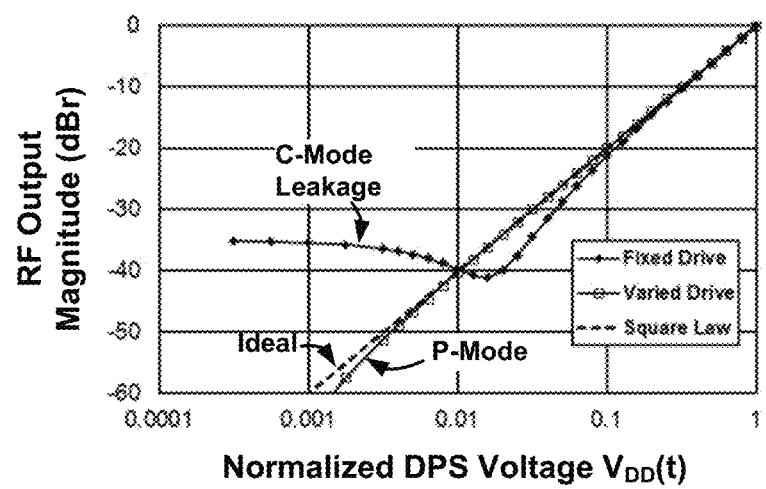
FIG. 7 is a plot of the RF output power of the polar modulation transmitter depicted in FIG. 4 when its PA is controlled to operated in C-mode compared to when controlled to operate in P-mode, highlighting how operating the PA in P-mode helps overcome leakage through the parasitic gate-drain capacitor $C_{gd}$ of the PA's power FET.

How controlling the PA 402 to operate in P-mode overcomes the inability of C-mode to reduce the signal envelope of the RF output $RF_{OUT}$ to zero or near zero when the intended AM dictates that it should can be understood by recognizing that the PA 402 comprises a power field-effect transistor (FET) 602 having a built-in parasitic gate-drain capacitor $C_{gd}$, as illustrated in FIG. 6. This parasitic gate-drain capacitor $C_{gd}$ is undesirable since its serves as a leakage path through which the drive signal $V_{DRV}$ can undesirably leak from the RF input of the PA 402 (gate of the power FET) to the PA's 402's RF output $RF_{OUT}$. FIG. 7 shows that gate-drain leakage is most problematic when the magnitude of the high drive level $V_H$ of the drive signal $V_{DRV}$ produced by the PA driver 404 is high, which is the case during C-mode operation since the magnitude of the high drive level $V_H$ must be high in order to force the PA 402 into compression. The plot also highlights the ability of P-mode operation to overcome the leakage problem. When the PA 402 is operating in C-mode and the normalized DPS voltage VDD2(t) is low, for example when the normalized DPS voltage VDD2(t) is below 0.01, the leaked drive signal is seen to fully dominate the RF output. In contrast, when the PA 402 is controlled to operate in P-mode, leakage of the drive signal $V_{DRV}$ through the parasitic gate-drain capacitor $C_{gd}$ is seen to be substantially eliminated. Even when the normalized DPS voltage drops below 0.01, the RF output $P_{OUT}$ in P-mode can be reduced to less than −60 dBr and the RF output follows the ideal square law very closely. (As explained above, the RF output power $RF_{OUT}$ of a PA is ideally proportional to the square of the magnitude of its DPS voltage VDD(t), and for all magnitudes of VDD(t). This ideal DPS response is shown in FIG. 7 by the "square law" straight line.) The ability to essentially eliminate gate-drain leakage and reduce the magnitude of the output signal envelope of $P_{OUT}$ to zero or near zero when the intended AM dictates that it should is attributable to the unique characteristics of P-mode operation.

It should be mentioned that because L-mode operation is also responsive to variations in the gate drive voltage $V_{GS}(t)$ one might consider using L-mode to minimize gate-drain leakage, instead of P-mode. However, L-mode operation would require reconfiguring the PA 402 to operate as a linear PA, which is significantly less efficient compared to a PA operating in P-mode. L-mode operation also lacks the two degrees of freedom ($V_{GS}$ and VDD2) that P-mode has to reduce the output signal envelope to zero or near zero. For these reasons, P-mode operation is therefore preferred. Further details of P-mode operation and the various advantages it provides are discussed below. First, a more detailed description of C-mode operation is provided.

Figure 8:
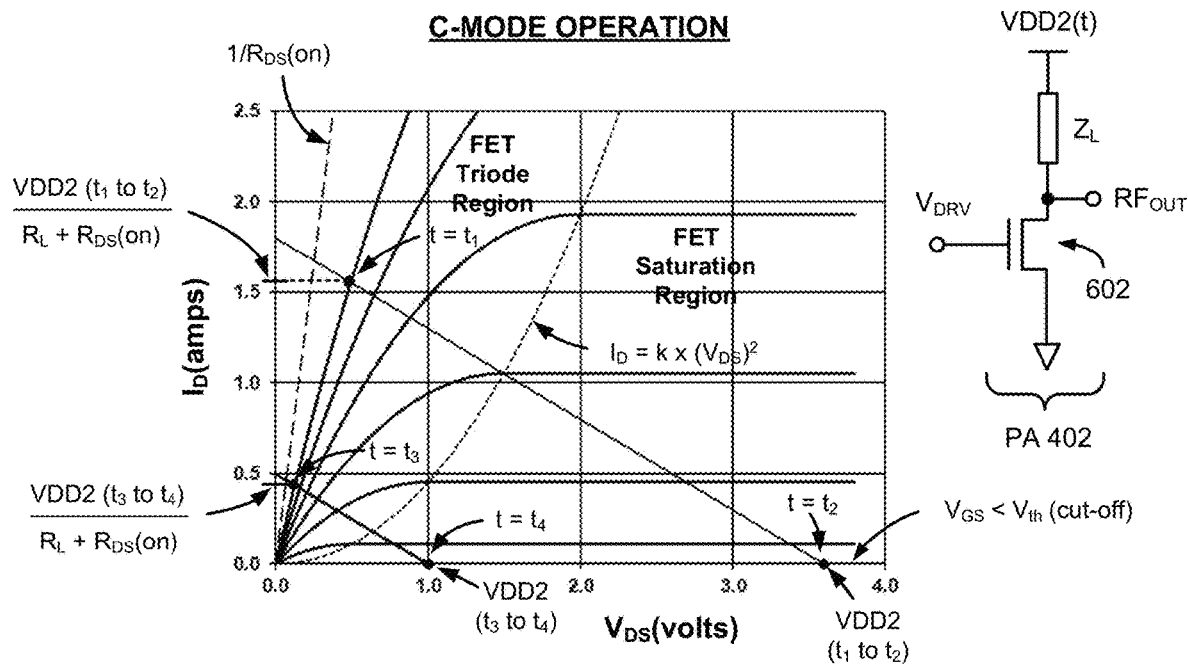
FIG. 8 is plot of the drain current $I_D$ versus drain-source voltage $V_{DS}$ characteristic curves of the power FET of the PA of the polar modulation transmitter depicted in FIG. 4, illustrating how the PA is controlled when operating in C-mode.

FIG. 8 is plot showing the drain current $I_D$ versus drain-source voltage $V_{DS}$ characteristic curves of the PA's 402's power FET 602 and how the PA 402 operates when in C-mode, including how it performs drain modulation. C-mode operation is shown for two different DPS voltages VDD2($t_1$ to $t_2$) and VDD2($t_3$ to $t_4$) over two different time spans—a first time span $t_1<t<t_2$ and a subsequent second time span $t_3<t<t_4$. During the first time span $t_1<t<t_2$, the DPS 406 is supplying the first DPS voltage VDD2($t_1$ to $t_2$). At time t=$t_1$, the drive signal $V_{DRV}$ is at its high drive level $V_H$, thus causing the PA 402 to compress and switch fully ON. Subsequently, at t=$t_2$, the drive signal $V_{DRV}$ drops to its low drive level $V_L$, which is lower than the threshold voltage $V_T$ of the power FET 602, causing the PA 402 to enter the cut-off region of the $I_D$ v. $V_{DS}$ characteristic curves, i.e., to switch OFF. Note that the line adjoining the t=$t_1$ (ON) and t=$t_2$ (OFF) states in the $I_D$ versus $V_{DS}$ characteristic curves is the load line for C-mode operation. In C-mode operation the PA 402 does not operate along the load line in the same sense that a linear PA operates along a load line. Instead, the PA 402 'snaps' between the compressed (ON) and cut-off (OFF) states, spending negligible time in between only during the very brief transitions between the two points. Subsequent to the first time span $t_1<t<t_2$ and during the second time span $t_3<t<t_4$ the DPS 406 is supplying the second DPS voltage VDD2($t_3$ to $t_4$), where VDD2($t_3$ to $t_4$)<VDD2($t_1$ to $t_2$). At time t=$t_3$, the drive signal $V_{DRV}$ is at its high drive level $V_H$, which causes the power PA 402 to once again compress and switch ON. Finally, at time t=$t_4$, the drive signal $V_{DRV}$ transitions to its low drive level $V_L$, causing the PA 402 to enter the cut-off region and switch OFF. Since when operating in C-mode the RF output power $P_{OUT}$ produced by PA 402 depends on the square of the magnitude of the DPS voltage $VDD2^2(t)$, the RF output power $P_{OUT}$($t_3$ to $t_4$) during the second time span $t_3<t<t_4$ is lower than the RF output power $P_{OUT}$($t_1$ to $t_2$) during the first time span $t_1<t<t_2$. The change from high RF output power during the first time span $t_1<t<t_2$ when the DPS voltage VDD(t)=VDD2($t_1$ to $t_2$) to lower RF output power during the time span $t_3<t<t_4$ when the DPS voltage VDD(t)=VDD2($t_3$ to $t_4$)<VDD2($t_1$ to $t_2$) thus illustrates the drain modulation property of the PA 402 when configured for C-mode operation.

Figure 9:
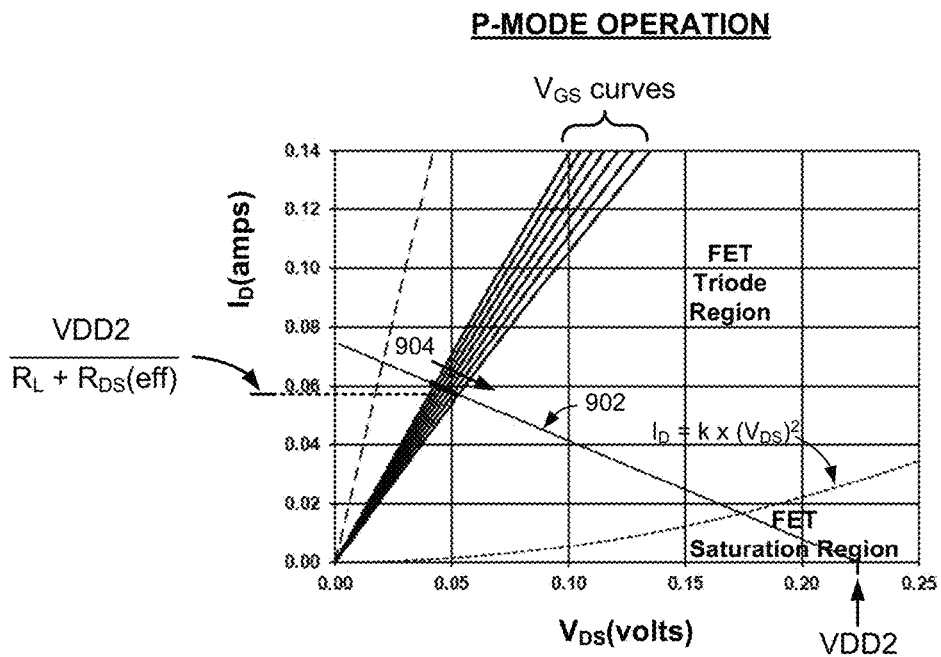
FIG. 9 is a zoomed in view of the $I_D$ versus $V_{DS}$ characteristic curves depicted in FIG. 8, illustrating how the PA of the polar modulation transmitter operates when controlled to operate in P-mode.

To further illustrate P-mode operation, reference is made to FIG. 9, which is a plot showing the drain current $I_D$ versus drain-source voltage $V_{Ds}$ characteristic curves of the PA's 402's power FET 602, zooming in on the region of the characteristic curves involved during P-mode operation. When operating in P-mode, the PA 402 neither operates as a switch (as in C-mode) nor as a controlled current source (as in L-mode). Rather, in P-mode the PA 402 operates as what may be referred to as a "controlled variable resistance" (represented in FIG. 9 as an "effective" drain-source resistance $R_{DS}$(eff)). Further, unlike in L-mode in which the PA 402 would be biased to operate entirely within the saturation region, and unlike in C-mode in which the PA 402 is switched between the compressed area of the triode region and the cut-off region, in P-mode the PA 402 is controlled to operate entirely in the triode region or entirely in the deep triode region. The group of $V_{GS}$ curves and their intersection with the load line 902 represents the values that the high drive level $V_H$ of the drive signal $V_{DRV}$ may have when the PA 402 is operating in P-mode during any given low-magnitude event. Since P-mode is activated only when the magnitude of the DPS voltage VDD2(t) is low (specifically, during a low-magnitude event), it should be understood that the magnitude of VDD2 during this P-mode operation example is much lower than the DPS voltages VDD2($t_1$ to $t_2$) and VDD2($t_3$ to $t_4$) applied by the DPS 406 during the C-mode operation discussion above, i.e., VDD2 (P-mode) <<VDD2($t_3$ to $t_4$)<VDD2($t_1$ to $t_2$). The magnitude of the high drive level $V_H$ ($V_{GS}$(t)) across the power FET 602) is reduced in accordance with each successive $V_{GS}$ curve following the direction of the arrow 904. Which of these values is used to drive the PA 402 is preferably determined at baseband by a digital signal processor (DSP), possibly taking into consideration predetermined leakage characteristics of the PA's 402's power FET 602. Further details concerning P-mode operation may be found in commonly owned U.S. Pat. No. 9,397,713, entitled "Polar Modulation Using Product Mode," which is incorporated herein by reference.

Figure 10:
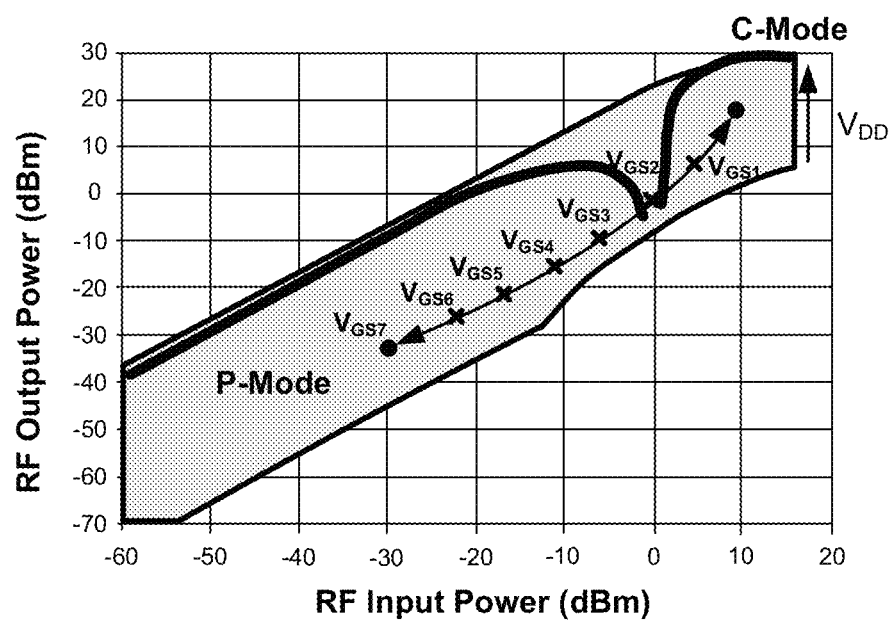
FIG. 10 is a reproduction of the Booth chart in FIG. 5, with various values of the drive signal $V_{DRV}=V_{GS}(t)$ overlaying the Booth chart to further illustrate C-mode and P-mode operation of the PA of the polar modulation transmitter depicted in FIG. 4.

FIG. 10 is a reproduction of the Booth chart originally presented in FIG. 5, with various values of the high drive level $V_H=V_{GS}$ of the PA drive signal $V_{DRV}$ superimposed on the chart. The embellished Booth chart is presented here to further illustrate how the PA driver $V_H$ controller 408 and PA driver 404 work together during a transition from C-mode to P-mode. So long as the input amplitude modulating signal AM(t) maintains a magnitude higher than the C-mode/P-mode voltage threshold $V_{C-P,TH}$, the PA driver $V_H$ controller 408 produces an output supply voltage $V_{DRV,SUPP}$ for the PA driver 404 that causes the PA driver 404 to produce a drive signal $V_{DRV}$ with a sufficiently high drive level $V_H$ to maintain the PA 402 in C-mode. However, when the magnitude of the input amplitude modulating signal AM(t) begins to fall sharply toward an impending low-magnitude event and/or traverses the C-mode/P-mode voltage threshold $V_{C-P,TH}$, which as explained below is preferably determined by a DSP at baseband, the PA driver $V_H$ controller 408 reduces the supply voltage $V_{DRV,SUPP}$ to the PA driver 406 so that the PA driver 404 lowers the high drive level $V_H=V_{Gs}$ by an amount sufficient to cause the PA 402 to commence P-mode operation. As the DSP detects the progression of the low-magnitude event, the PA driver $V_H$ controller 408 continues lowering the supply voltage $V_{DRV,SUPP}$ to the PA driver 406, causing the high drive level $V_H=V_{GS}$ of $V_{DRV}$ to reduce in magnitude, from $V_{GS3}$ to $V_{GS4}$, from $V_{GS4}$ to $V_{GS5}$ and so on, until the inflection point of the low-magnitude event is finally reached. Then, as the DSP detects the magnitude of the input amplitude modulating signal AM(t) rising, the PA driver $V_H$ controller 408 begins increasing the supply voltage $V_{DRV,SUPP}$ to the PA driver 406, causing the high drive level $V_H=V_{GS}$ of $V_{DRV}$ to increase in magnitude, for example, from $V_{GS7}$ to $V_{GS6}$, from $V_{GS6}$ to $V_{GS5}$, etc., until the DSP determines that the magnitude of the input amplitude modulating signal AM(t) has risen to a value higher than the C-mode/P-mode voltage threshold $V_{C-P,TH}$. When that occurs, the PA driver $V_H$ controller 408 begins to produce an output supply voltage $V_{DRV,SUPP}$ for the PA driver 404 that causes the PA driver 404 to produce a drive signal $V_{DRV}$ with a sufficiently high drive level $V_H$ to cause the PA 402 to compress and resume C-mode operation.

Figure 11:
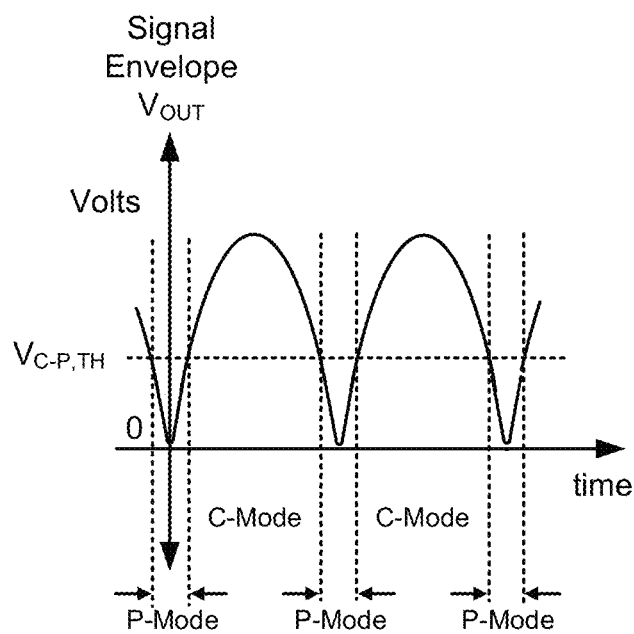
FIG. 11 is a simplified signal diagram illustrating how the polar modulation transmitter depicted in FIG. 4 is able to reproduce low-magnitude events in its RF output when its PA is controlled to operate in P-mode.
Figure 12:
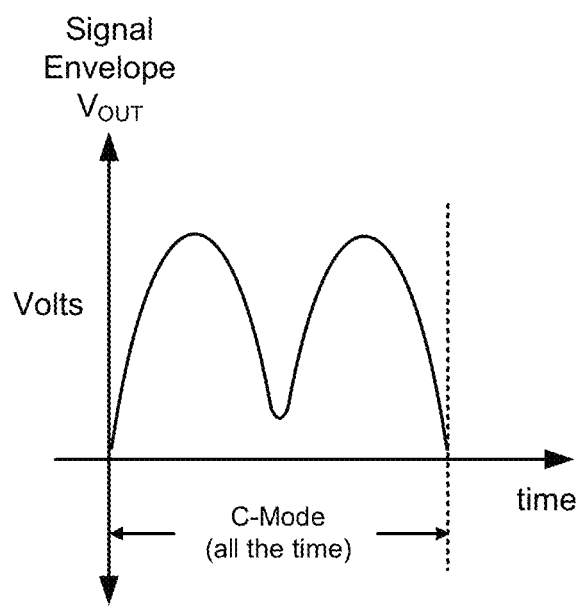
FIG. 12 is a simplified signal diagram illustrating how a polar modulation transmitter with a PA that can only operate in C-mode is unable to reproduce low-magnitude events in its RF output.
Figure 13:
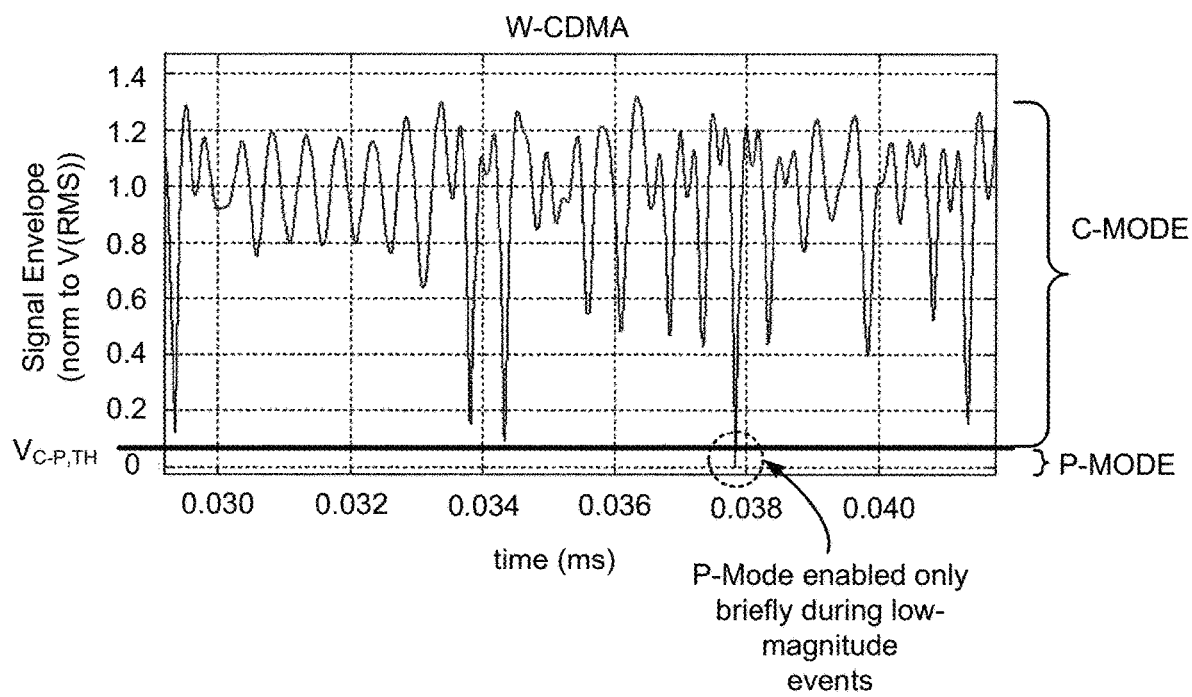
FIG. 13 is waveform snippet of a typical low-magnitude event in a W-CDMA signal, highlighting how low-magnitude events are typically short in duration.

The ability of the polar modulation transmitter 400 to control its PA 402 to operate in C-mode results in the polar modulation transmitter having high energy efficiency, and its ability to configure the PA 402 to operate in P-mode allows the signal envelope of its RF output $RF_{OUT}$ to reduce to zero or near zero when the intended AM dictates that it should. The ability to reproduce low-magnitude events in the RF output signal envelope is highlighted in the simplified drawing of the RF output voltage signal envelope depicted in FIG. 11 and compared to the inability of C-mode-only operation to reproduce similar low-magnitude events in FIG. 12. FIG. 13, which provides a more realistic depiction of the duration of a typical low-magnitude event in W-CDMA applications, highlights the fact that low-magnitude events are typically short in duration, at least when W-CDMA signal envelopes are involved. So, although operating the PA 402 in P-mode is less energy efficient than operating it in C-mode, the degradation in energy efficiency due to operating in P-mode is negligible. In other words, the enhanced bandwidth of the polar modulation transmitter 400 and resulting increase in output dynamic range are benefits that far exceed the small sacrifice in energy efficiency.

Figure 14:
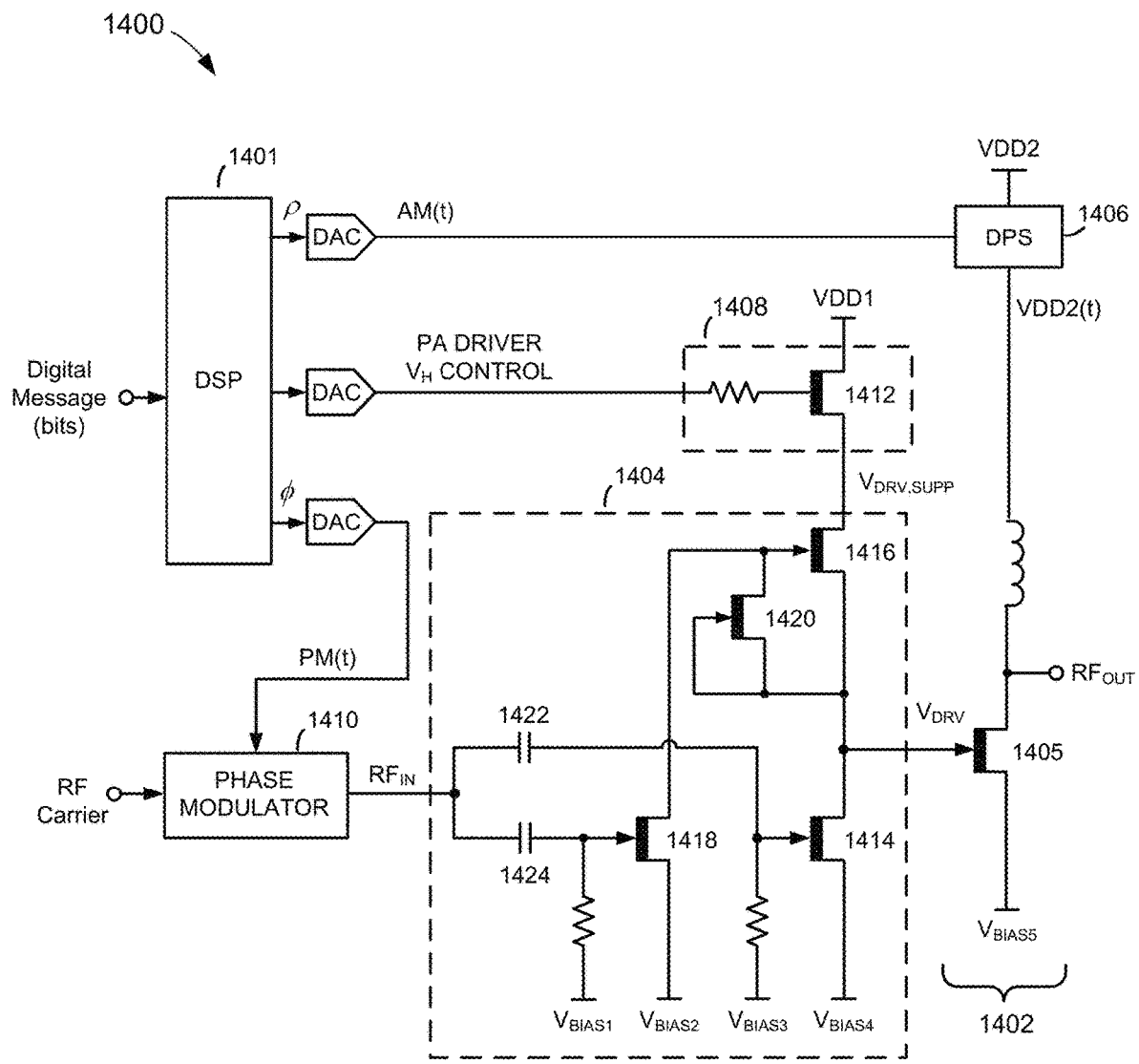
FIG. 14 is a drawing depicting a polar modulation transmitter modeled after the polar modulation transmitter depicted in FIG. 4, according to one embodiment of the invention.

FIG. 14 is a drawing depicting a polar modulation transmitter 1400 modeled after the polar modulation transmitter 400 described above, in accordance with one exemplary embodiment of the invention. Similar to the polar modulation transmitter 400 depicted in FIG. 4, the polar modulation transmitter 1400 comprises a PA 1402, a PA driver 1404, a DPS 1406, a PA driver $V_H$ controller 1408, and a phase modulator 1410. The polar modulation transmitter 1400 also includes a DSP 1401 and digital-to-analog converters (DACs) 1403 that generate the analog amplitude and phase modulating signals AM(t) and PM(t) for the DPS 1406 and phase modulator 1410, and a PA driver $V_H$ control signal, which is applied to the gate of FET 1412 of the PA driver $V_H$ controller 1408, which in this exemplary embodiment of the invention comprises a source follower. Note that the various FETs used in the PA 1402, PA driver 1404, and PA driver $V_H$ controller 1408 are all n-channel, depletion mode metal-semiconductor FETs (MESFETs) in this exemplary embodiment and, preferably, aluminum gallium nitride/gallium nitride (AlGaN/GaN) high electron mobility transistors (or "GaN-HEMTs"). Accordingly, in FIG. 14 the various FETs are depicted using the conventional n-channel, depletion mode transistor symbol commonly used for n-channel, depletion mode MESFETs. It should be mentioned, however, that although GaN-HEMTs are preferred, other types of transistors could be alternatively used, as will be appreciated by those of ordinary skill in the art. For example, the power FET 1405 in the PA 1402 could be some other compound semiconductor power FET or a silicon carbide power MOSFET, instead of a GaN-HEMT.

The PA driver 1404 comprises a bootstrap Class-D driver, similar to as described in commonly owned U.S. Pat. No. 9,806,678, entitled "Bootstrap Class-D Wideband RF Power Amplifier," which is incorporated herein by reference, and comprises first, second, third and fourth FETs 1414, 1416, 1418 and 1420. Because the FETs in this exemplary embodiment of the invention are depletion mode FETs, i.e., "normally ON" FETs, their threshold voltages $V_T$ are negative. In the exemplary embodiment described here the threshold voltages $V_T$ are assumed to be the same for all four FETs 1414, 1416, 1418 and 1420. While this assumption is not an absolute requirement insofar as the invention is concerned, it is a realistic assumption since in a typical integrated circuit implementation the threshold voltage $V_T$ is normally fixed by the fabrication process and therefore essentially the same for all FETs. It should also be mentioned that in most n-channel, depletion mode FETs, a gate-source voltage $V_{GS}$ rising to a level of 0V will be effective at fully forming a conducting channel between drain and source and therefore sufficient to switch the FETs fully ON. Accordingly, in the description below the PA driver 1404 it is assumed that each FET is ON when its gate-source voltage $V_{GS}$ rises to a level of zero volts (0V) or greater.

The "Class-D" property of the PA driver 1404 means that the first FET 1414 is switched ON when the second FET 1416 is switched OFF, and vice versa, and that the first and second FETs 1414 and 1416 are never ON at the same time, except perhaps during the very brief transitions between the first FET 1414 being switched ON and the second FET 1416 being switched OFF, and vice versa. In the description that follows the first FET 1414 is referred to as the "low-side FET" and the second FET 1416 is referred to as the "high-side FET." Additionally, the third FET 1418 is referred to as the "control FET," and the fourth FET 1420, which is configured to serve as a controlled resistor, is referred to as the "bootstrap resistor."

Figure 15A:
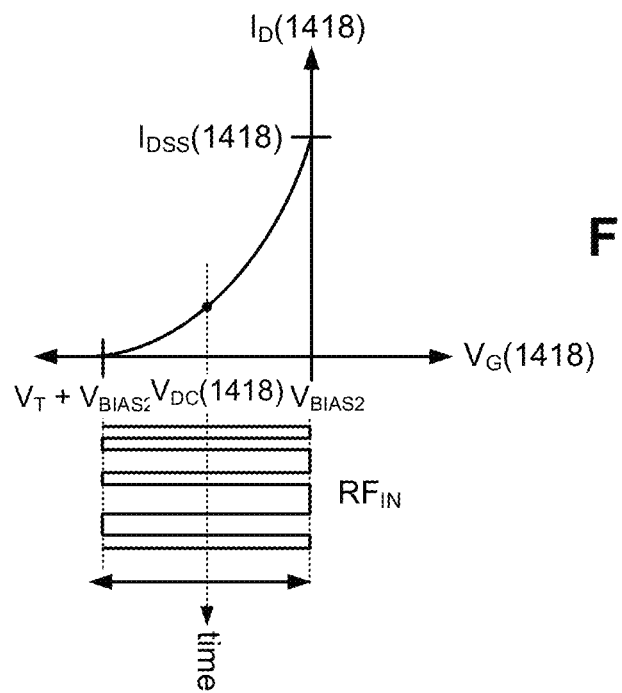
FIGS. 15A and 15B are drain current $I_D$ versus gate voltage $V_G$ curves of the control FET and low-side FET, respectively, of the Class-D PA driver of the polar modulation transmitter depicted in FIG. 14, highlighting the DC biasing and level-to-level swing of the phase modulated RF carrier $RF_{IN}$ applied to the gates of the control and low-side FETs.
Figure 15B:
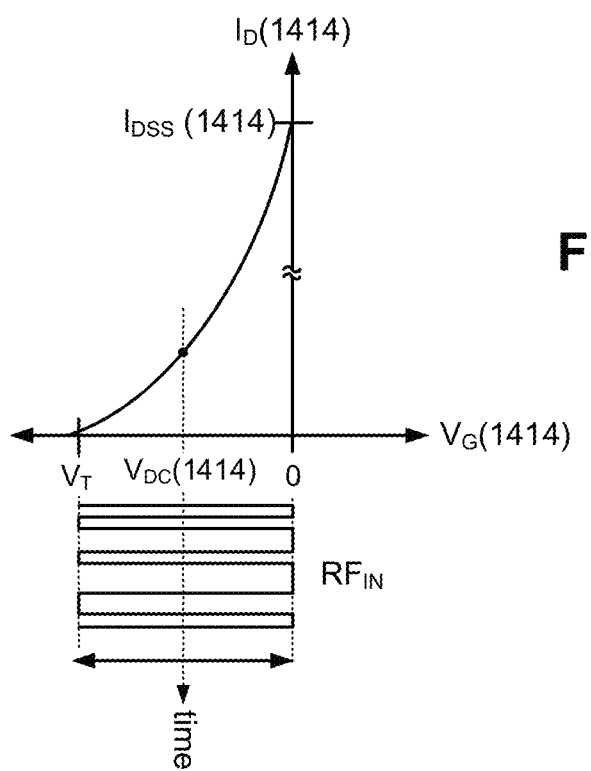

As shown in FIG. 14, the phase modulated RF input signal $RF_{IN}$ produced by the phase modulator 1410 is AC coupled to both the gate of the low-side FET 1414 and gate of the control FET 1418, via DC blocking capacitors 1422 and 1424, and the gates of the low-side and control FETs 1414 and 1418 are biased by DC bias supply voltages $V_{BIAS3}$ and $V_{BIAS1}$, to establish DC operating points $V_{DC}(1414)$ and $V_{DC}(1418)$ for the low-side and control FETs 1414 and 1418. When the low-side FET 1414 and control FET 1418 are ON, a voltage $V_{BIAS2} - V_{BIAS4}$ drops across the gate-source terminals of the high-side FET 1416. This voltage drop $V_{BIAS2} - V_{BIAS4}$ is also dropped across the bootstrap resistor 1420, since it is connected across the gate-source terminals of the high-side FET 1416, and therefore must be equal to or less than (i.e., more negative than) the threshold voltage $V_T$ in order to pinch off the conducting channel in the high-side FET 1416 and thereby switch it OFF. In one embodiment of the invention $V_{BIAS4}$ is set to 0V and $V_{BIAS2}$ is set to some negative voltage less than, i.e., more negative than, $V_T$. With these values for $V_{BIAS2}$ and $V_{BIAS4}$, appropriate values for the DC gate bias voltages $V_{BIAS1}$ and $V_{BIAS3}$ can be determined to establish the DC operating points $V_{DC}(1418)$ and $V_{DC}(1414)$ for the control FET 1418 and low-side FET 1414. In one embodiment of the invention the DC gate bias voltages $V_{BIAS1}$ and $V_{BIAS3}$ are set so that the gate voltage $V_G(1418)$ applied to the control FET 1418 swings between a high value of $V_{BIAS2}$ and a low value of $V_T + V_{BIAS2}$, as illustrated in FIG. 15A, and so that the gate voltage $V_G(1414)$ applied to the low-side FET 1414 swings between a high value of 0V and a low value of less than $V_T$, as illustrated in FIG. 15B. With this biasing arrangement the gate-source voltage $V_{GS}(1418)$ applied across the gate-source terminals of the control FET 1418 and the gate-source voltage and $V_{GS}(1414)$ applied across the gate-source terminals of the low-side FET 1414 both swing between a high of 0V and a low value of $V_T$, appropriate for switching the two FETs 1418 and 1414 ON and OFF.

Whereas the control FET 1418 and low-side FET 1414 are switched ON and OFF under the direct control of the phase modulated RF input signal $RF_{IN}$ produced by the phase modulator 1410, the high-side FET 1416 is switched ON and OFF by the coordinated control and operation of the low-side FET 1414, control FET 1418, and bootstrap resistor 1420. Initially, when the high-side FET 1416 is ON and as the gate voltages $V_G(1414)$ and $V_G(1418)$ applied to the gates of the low-side and control FETs 1414 and 1418 rise to the upper ends of their swings (see FIGS. 15A and 5B above), the low-side and control FETs 1414 and 1418 turn ON and pull the gate of the high-side FET 1416 down to $V_{BIAS2}$ and the source of the high-side FET 1416 down to $V_{BIAS4}$. Since $V_{BIAS2} < V_T < V_{BIAS4} = 0V$, the gate-source voltage $V_{GS}(1416)$ across the gate-source terminals of the high-side FET 1416 becomes clamped to a voltage less than (i.e., more negative than) the threshold voltage $V_T$. The input gate capacitor of the high-side FET 1416 thus rapidly discharges through the control FET 1418 into the bias supply $V_{BIAS2}$, causing the high-side FET 1416 to turn OFF. Since the low-side FET 1414 switches ON when the high-side FET 1416 switches OFF, the output voltage $V_{OUT}$ produced at the RF output $RF_{OUT}$ of the PA 1402 is therefore pulled down to $V_{BIAS4} = 0V$. When the gate voltages $V_G(1414)$ and $V_G(1418)$ applied to the gates of the low-side and control FETs 1414 and 1418 fall back down to the lower ends of their swings, the high-side FET 1416 is switched back ON, the control and low-side FETs 1418 and 1414 switch back OFF, and the bootstrap resistor 1420 bootstraps current from the RF output of the PA driver 1404 into the gate of the high-side FET 1416. The bootstrap current is initially supplied by the high-side FETs 1416's gate-source capacitor $C_{gs}$, which was previously reverse-charged by $V_{BIAS2}$ during the time the low-side and control FETs 1414 and 1418 were previously turned ON. However, shortly after the high-side FET 1416 begins turning ON and as the low-side FET 1414 is being turned OFF, current supplied from the PA driver's 1404's power supply VDD1 rapidly completes the forward charging of the gate-source capacitor $C_{gs}$. Forward charging the gate-source capacitor $C_{gs}$ happens very rapidly and is completed on the order of picoseconds or less, depending on the resistance of the bootstrap resistor 1420 and the capacitance of the gate-source capacitor $C_{gs}$. After the gate-source capacitor $C_{gs}$ has fully charged, the voltage drop across the bootstrap resistor 1420 falls to zero (since no current is then flowing through it). Since the bootstrap resistor 1420 is connected across the gate-source terminals of the high-side FET 1416, the gate-source voltage $V_{GS}(1416)$ of the high-side FET 1416 also decreases to 0V. With a $V_{GS}(1416) = 0V$ applied across its gate-source terminals, the high-side FET 1416 is then fully ON and the output voltage $V_{OUT}$ produced at the RF output $RF_{OUT}$ of the PA 1402 is pulled up to the supply voltage $V_{DRV,SUPP}$ then being supplied by the PA driver $V_H$ controller 1408. If necessary, the supply VDD1 will supply additional current to the gate of the high-side FET 1416, via the bootstrap resistor 1420, in order to maintain the high-side FET 1416 in an ON state. This bootstrapping effect continues until the gate voltages $V_G(1414)$ and $V_G(1418)$ to the low-side and control FETs 1414 and 1418 once again increase to the upper ends of their swings and cause them to switch back ON. With the control FET 1418 back ON, the gate-source capacitor $C_{gs}$ once again rapidly discharges through the control FET 1418 into the bias supply $V_{BIAS2}$, causing the high-side FET 1416 to turn back OFF.

As can be seen in FIG. 14, the PA driver $V_H$ controller 1408 in polar modulation transmitter 1400 comprises a source follower (i.e., common drain amplifier) The source follower 1408 has a high input impedance and a low output impedance and produces a driver supply voltage $V_{DRV,SUPP}$ that serves as the power supply for the PA driver 1404. The power supply voltage $V_{DRV,SUPP}$ is adjustable by the DSP 1401, depending on the magnitude of the input amplitude modulating signal AM(t), and establishes the upper rail voltage of the Class-D driver 1404. It should be mentioned that in addition to reducing the drive impedance to the driver-supply node and decreasing loading from the PA driver $V_H$ control input, the source follower also has the effect of increasing the bandwidth of the polar modulation transmitter 1400 through stronger current drive onto parasitic capacitances on the driver-supply node.

Because the PA driver 1404 switches rail-to-rail and the adjustable power supply voltage $V_{DRV,SUPP}$ supplied at the output of the source follower 1408 determines the high drive level $V_H$ of the drive signal $V_{DRV}$ applied to the PA 1402 the high drive level $V_H$ of magnitude at any give time determines whether the PA 1402 operates in C-mode or P-mode. Note that in one embodiment of the invention the drive signal $V_{DRV}$ is AC coupled to the gate of the power FET 602 in the PA 402 and the gate of the power FET 602 is biased so that the low and high drive levels $V_L$ and $V_H$ of the drive signal $V_{DRV}$ are appropriate to switch the power FET 602 ON and OFF. In a preferred embodiment, however (depicted in FIG. 14), the drive signal $V_{DRV}$ is DC coupled to the gate of the power FET 602 and $V_{BIAS5}$ at the source of the power FET 602 is set so that the low drive level $V_L=(V_{BIAS4}-V_{BIAS5})<V_T$. By DC coupling the drive signal $V_{DRV}$ to the input of the PA 1402, the need to charge and discharge an AC coupling capacitor is avoided and DC stability problems that might otherwise arise due to the presence of an AC coupling capacitor are also avoided.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A polar modulation transmitter, comprising:
    a dynamic power supply (DPS) that generates and supplies, at a DPS output, a DPS voltage having a magnitude that follows an input amplitude modulating (AM) signal;
    a phase modulator that modulates a radio frequency (RF) carrier by an input phase modulating (PM) signal to produce a phase modulated RF carrier;
    a power amplifier (PA) comprising a power field effect transistor (FET) having a drain coupled to the DPS output;
    a PA driver that generates a PA drive signal $V_{DRV}$ from the phase modulated RF carrier, the PA drive signal $V_{DRV}$ having a high drive level $V_H$ and a low drive level $V_L$;
    a PA driver $V_H$ controller that controls a magnitude of a driver power supply voltage $V_{DRV,SUPP}$ supplied to a driver power supply input of the PA driver,
    wherein the driver power supply voltage $V_{DRV,SUPP}$ determines the high drive level $V_H$ of the PA drive signal $V_{DRV}$ produced by the PA driver, and the PA driver $V_H$ controller is configured to maintain the magnitude of the driver power supply $V_{DRV,SUPP}$ and the high drive level $V_H$ at a magnitude sufficient to force the PA to operate in a compressed mode (C-mode) but to lower the driver power supply $V_{DRV,SUPP}$ and the high drive level $V_H$ to force the PA to operate in a product mode (P-mode) during times low-magnitude events are present in the DPS voltage.

2. The polar modulation transmitter of claim 1, wherein the PA driver comprises a Class-D amplifier.

3. The polar modulation transmitter of claim 1, wherein the PA driver $V_H$ controller comprises a source follower.

4. The polar modulation transmitter of claim 1, wherein the PA drive signal $V_{DRV}$ generated by the PA driver is DC coupled to a gate of the PA's power FET.

5. The polar modulation transmitter of claim 1, further comprising a digital signal processor (DSP) configured to:
    determine when low-magnitude events will occur in the DPS voltage; and
    direct the PA driver $V_H$ controller to lower the driver power supply voltage $V_{DRV,SUPP}$ and the high drive level $V_H$ of the PA drive signal $V_{DRV}$ so when low-magnitude events do occur in the DPS voltage the PA is forced to operate in P-mode for the durations of the low-magnitude events.

6. The polar modulation transmitter of claim 5, wherein the DSP is configured to monitor an input amplitude modulating signal to determine when low-magnitude events will occur in the DPS voltage.

7. The polar modulation transmitter of claim 6, wherein the DSP is configured to determine that low-magnitude events will occur in the DPS voltage when the magnitude of the input amplitude modulating signal falls below a predetermined C-mode/P-mode voltage threshold.

8. A method of increasing the bandwidth of a polar modulation transmitter, comprising:
    generating a dynamic power supply (DPS) voltage that follows an input amplitude modulating signal;
    coupling the DPS voltage to a power supply input of a power amplifier (PA);
    generating a PA drive signal $V_{DRV}$ having a high drive level $V_H$ and a low drive level $V_L$ at an output of a PA driver;
    driving the PA by the PA drive signal $V_{DRV}$;
    generating a driver power supply voltage control signal; and
    applying the driver power supply voltage control signal to an input of a source follower having its source coupled to a power supply input of the PA driver,
    wherein the high drive level $V_H$ of the PA drive signal $V_{DRV}$ is determined by the driver power supply voltage control signal and the driver power supply voltage control signal is maintained at a value that causes the PA to operate in a compressed mode (C-mode) most of the time but is adjusted to cause the PA to operate in a product mode (P-mode) during times low-magnitude events occur in the DPS voltage.

9. The method of claim 8, further comprising:
    monitoring a magnitude of the input amplitude modulating signal to determine when a low-magnitude event will occur in the DPS voltage; and
    adjusting the driver power supply voltage control signal so that when the low-magnitude event does occur in the DPS voltage the high drive level $V_H$ of the PA drive signal $V_{DRV}$ is maintained at a level or levels that force(s) the PA to operate in P-mode for the duration of the low-magnitude event.

10. The method of claim 9, further comprising:
    comparing the monitored magnitude of the input amplitude modulating signal to a C-mode/P-mode voltage threshold $V_{C-P,TH}$;
    determining that a low-magnitude event will occur in the DPS voltage if the magnitude of the input amplitude modulating signal falls below the C-mode/P-mode voltage threshold $V_{C-P,TH}$; and
    adjusting the driver power supply voltage control signal so that when the low-magnitude event does occur in the DPS voltage the high drive level $V_H$ of the PA drive signal $V_{DRV}$ is maintained at a level or levels that force(s) the PA to operate in P-mode for the duration of the low-magnitude event.

* * * * *